(12) United States Patent
Nam et al.

(10) Patent No.: US 10,018,905 B2
(45) Date of Patent: Jul. 10, 2018

(54) PHASE SHIFT BLANKMASK AND PHOTOMASK

(71) Applicant: S&S TECH Co., Ltd., Daegu-si (KR)

(72) Inventors: Kee-Soo Nam, Daegu-si (KR); Cheol Shin, Daegu-si (KR); Jong-Hwa Lee, Daegu-si (KR); Chul-Kyu Yang, Daegu-si (KR); Min-Ki Choi, Daegu-si (KR); Chang-Jun Kim, Daegu-si (KR); Kyu-Jin Jang, Daegu-si (KR)

(73) Assignee: S & S TECH CO., LTD, Daegu-shi (KR)

( * ) Notice: Subject to any disclaimer, the term of this patent is extended or adjusted under 35 U.S.C. 154(b) by 250 days.

(21) Appl. No.: 14/945,686

(22) Filed: Nov. 19, 2015

(65) Prior Publication Data
US 2016/0291451 A1    Oct. 6, 2016

(30) Foreign Application Priority Data

Apr. 6, 2015  (KR) .................... 10-2015-0048094

(51) Int. Cl.
*G03F 1/26* (2012.01)
*G03F 1/58* (2012.01)

(52) U.S. Cl.
CPC . *G03F 1/26* (2013.01); *G03F 1/58* (2013.01)

(58) Field of Classification Search
CPC ...................................... G03F 1/26; G03F 1/58

USPC ............................................................ 430/5
See application file for complete search history.

(56) References Cited

U.S. PATENT DOCUMENTS

| | | | |
|---|---|---|---|
| 2007/0020534 A1* | 1/2007 | Yoshikawa | G03F 1/32 430/5 |
| 2010/0092874 A1* | 4/2010 | Nozawa | G03F 1/32 430/5 |
| 2017/0075210 A1* | 3/2017 | Shishido | G03F 1/32 |

FOREIGN PATENT DOCUMENTS

| | | |
|---|---|---|
| KR | 10-2010-0002067 | 1/2010 |
| KR | 10-2014-0095955 | 8/2014 |
| WO | WO 2015/146421 A1 * | 10/2015 |

* cited by examiner

*Primary Examiner* — John A McPherson
(74) *Attorney, Agent, or Firm* — Juan Carlos A. Marquez; Marquez IP Law Office, PLLC

(57) ABSTRACT

Disclosed is a phase-shift blankmask for manufacturing a photomask, which can achieve a fine pattern of not greater than 32 nm, preferably not greater than 14 nm, and more preferably not greater than 10 nm.

To this end, a phase-shift film, a light-shielding film, an etch-stopping film and a hard film are provided on a transparent substrate, in which the light-shielding film has a multi-layered structure of two or more layers different in composition, one of which essentially contains oxygen (O), a light-shielding layer essentially having oxygen (O) occupies 50%~100% of the whole thickness of the light-shielding film, and the phase-shift film has a transmissivity of 10%~50%.

15 Claims, 3 Drawing Sheets

PHASE SHIFT BLANKMASK AND PHOTOMASK

CROSS-REFERENCE TO RELATED APPLICATION

This application claims priority to and the benefit of Korean Patent Application No. 10-2015-0048094, filed on Apr. 6, 2015, the disclosure of which is incorporated herein by reference in its entirety.

BACKGROUND

1. Field of the Invention

The present invention relates to a phase-shift blankmask and a photomask, and more particularly to a phase-shift blankmask and a photomask which can achieve a fine pattern of not greater than 32 nm and preferably not greater than 14 nm.

2. Discussion of Related Art

Today, a finer pattern of a circuit has been continuously demanded in accordance with higher integration of large-scale integrated circuits (ICs). In case of a blankmask, a binary blankmask and a phase-shift blankmask have been conventionally developed and commercialized, and a binary blankmask having a hard film has recently been developed and used for a hard mask.

With recent achievement of a high-precise and fine pattern of not greater than 32 nm, a phase-shift blankmask with a hard film has been developed. The phase-shift blankmask with the hard film has a basic structure where a light-shielding film, the hard film and a resist film are stacked on the phase-shift film, and the hard film is made of a compound that generally contains silicon (Si) to secure etch selectivity against the under light-shielding film at dry etching.

However, the following problems arise since the hard film is made of the silicon (Si) compound. First, as the hard film made of the silicon (Si) compound contacts the bottom of the resist film, an electron charge-up phenomenon occurs in the hard film during an exposure process using an electron beam for manufacturing a photomask. The electron charge-up phenomenon causes a curved movement of electrons during the exposure process, thereby causing a position error while manufacturing the photomask. Therefore, it is difficult to apply the hard film made of the silicon (Si) compound to the exposure process based on double patterning, multi-patterning or the like technique where a pattern position is more strictly controlled.

Further, there is a problem of adhesion between the hard film made of the silicon (Si) compound and the resist film. In other words, high surface-energy of the hard film made of the silicon (Si) compound causes the resist film to be partially uncoated on the hard film when the resist film is applied or to be peeled off after a development process following the exposure process. To solve such a problem of adhesion between the resist film and the hard film, hexamethyldisilazane (HMDS) and the like surface treatment process has been performed. However, the additional surface treatment process such as the HMDS may cause a defect. For example, spot or scum defects may occur due to strong adhesion of the HMDS after the development process.

If the under light-shielding film is etched using the resist film as an etching mask after forming the light-shielding film on the phase-shift film without using the hard film, it is also difficult to form a fine pattern of not greater than 32 nm because of the thickness of the resist film, loading effects, etc.

By the way, research on the phase-shift blankmask has recently been conducted so that the phase-shift film can have high transmissivity without limiting the transmissivity to about 6%. The phase-shift blankmask having high transmissivity can get a fine the pattern by setting the transmissivity to about 6% or higher and increasing destructive interference at a pattern edge portion. However, the phase-shift film needs to have a thickness of not less than about 1000 Å in order to satisfy optical properties such as the transmissivity, a phase-shift degree, etc. and it is thus difficult to make a fine pattern since this thickness is greater by 1.5 times than a general thickness (650 Å~700 Å) of the phase-shift film. Besides, if a lot of light elements are contained so as to increase the transmissivity of the phase-shift film, defects may occur while forming the pattern since the chemical resistance becomes weak.

SUMMARY OF THE INVENTION

The present invention is directed to a phase-shift blankmask and a photomask using the same, in which a phase-shift film having high transmissivity is formed to achieve a fine pattern of not greater than 32 nm and preferably not greater than 14 nm.

According to an aspect of the present invention, there is provided a phase-shift blankmask provided with a phase-shift film and a light-shielding film on a transparent substrate, the light-shielding film comprising multi-layered films of two or more layers containing at least one of oxygen (O) and nitrogen (N), wherein at least one of the films essentially contains oxygen (O), the film essentially containing oxygen (O) occupying 50% to 95% of the whole thickness of the light-shielding film.

The phase-shift film may have a transmissivity of 10% to 50% with respect to exposure light having a wavelength of 193 nm or 248 nm.

The phase-shift film may comprise one of silicon (Si), metal silicide, silicon (Si) compounds, and metal silicide compound, wherein the silicon (Si) compounds and the metal silicide compound is respectively comprised by combining silicon (Si) and metal silicide with one or more light elements among nitrogen (N), oxygen (O), carbon (C), boron (B) and hydrogen (H).

The light-shielding film may comprise chromium (Cr) or one of chromium (Cr) compounds where chromium (Cr) is combined with one or more light elements among nitrogen (N), oxygen (O), carbon (C), boron (B) and hydrogen (H).

The light-shielding film may have a thickness of 300 Å~700 Å, and an etching speed of 1.0 Å/sec~4.0 Å/sec.

At least one of an etch-stopping film and a hard film is further provided on the light-shielding film.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

Hereinafter, embodiments of the present invention will be described in more detail with reference to the accompanying drawings. However, the embodiments are provided for illustrative purpose only and should not be construed to limit the scope of the invention. Therefore, it will be appreciated by a person having an ordinary skill in the art that various modifications and equivalents can be made from the embodiments. Further, the scope of the present invention has to be defined in the appended claims.

Figure 1:
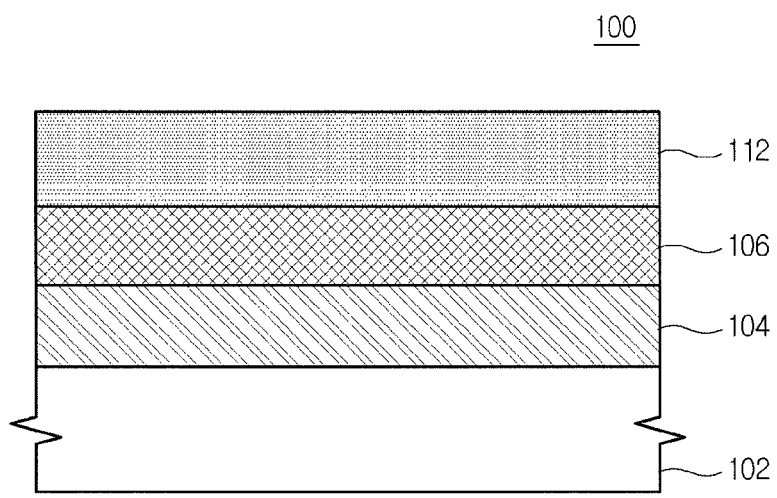
FIG. 1 is a cross-section view of a phase-shift blankmask according to a first embodiment of the present invention.
Figure 2:
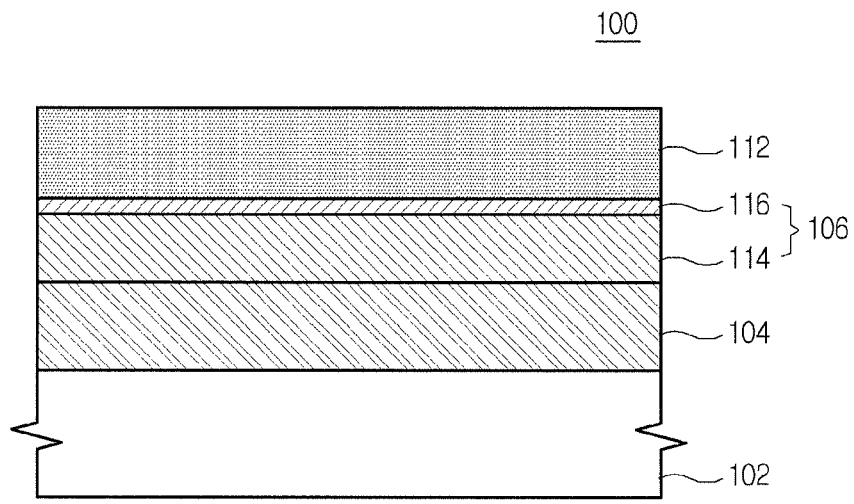
FIG. 2 is a cross-section view of a phase-shift blankmask according to a second embodiment of the present invention.

FIG. 1 is a cross-section view of a phase-shift blankmask according to a first embodiment of the present invention, and FIG. 2 is a cross-section view of a phase-shift blankmask according to a second embodiment of the present invention.

Referring to FIG. 1 and FIG. 2, a phase-shift blankmask 100 according to the present invention includes a transparent substrate 102; and a phase-shift film 104, a light-shielding film 106 and a resist film 112 that are stacked in sequence on the transparent substrate 102.

The transparent substrate 102 is made of quartz glass, synthesized quartz glass, and fluorine doped quartz glass. The flatness of the transparent substrate 102 affects the flatness of one among the thin films such as the phase-shift film 104, the light-shielding film 106, etc. formed thereon. If the flatness of the growing film surface is defined as a total indicator reading (TIR) value, the TIR value is controlled not to be greater than 100 nm, and preferably than 50 nm within an area of 142 mm$^2$.

The phase-shift film 104 contains one or more substances among silicon (Si), molybdenum (Mo), tantalum (Ta), vanadium (V), cobalt (Co), nickel (Ni), zirconium (Zr), niobium (Nb), palladium (Pd), zinc (Zn), chromium (Cr), aluminum (Al), manganese (Mn), cadmium (Cd), magnesium (Mg), lithium (Li), selenium (Se), copper (Cu), hafnium (Hf), tungsten (W), or includes one or more substances nitrogen (N), oxygen (O), carbon (C), boron (B), hydrogen (H) among in addition to that substance.

The phase-shift film 104 may for example contain either of silicon (Si) or a silicon (Si) compound such as SiN, SiC, SiO, SiCN, SiCO, SiNO, SiCON, SiB, SiBN, SiBC, SiBO, SiBCN, SiBCO, SiBNO and SiBCON. Further, the phase-shift film 104 may for example contain either of molybdenum silicide (MoSi) or a metal silicide compound including a molybdenum silicide (MoSi) compound such as MoSiN, MoSiC, MoSiO, MoSiCN, MoSiCO, MoSiNO, MoSiCON, MoSiB, MoSiBN, MoSiBC, MoSiBO, MoSiBCN, MoSiBCO, MoSiBNO and MoSiBCON The phase-shift film 104 is formed by adjusting a composition ratio between silicon (Si) and one or more light elements combined with silicon (Si) in order to satisfy a required transmissivity and a required phase-shift degree. In detail, if the phase-shift film 104 is made of a silicon (Si) compound, the phase-shift film 104 has a composition ratio of 40 at %~90 at % silicon (Si) and 10 at %~60 at % light element, and preferably has a composition ratio of 50 at %~85 at % silicon (Si) and 15 at %~50 at % light element is. Further, if the phase-shift film 104 is made of metal silicide or its compound, the phase-shift film 104 has a composition ratio among 0.1 at %~10 at % metal, 39 at %~90 at % silicon (Si), and 0 at %~60 at % light element, and preferably has a composition ratio among 0.1 at %~5 at % metal, 49 at %~80 at % silicon (Si), and 15 at %~50 at % light element.

The phase-shift film 104 may have a single-layered structure or a multi-layered structure formed with two or more layers, or may have a single film structure where a composition ratio is uniform or a continuous film structure where a composition ratio is continuously changed. If the phase-shift film 104 has the multi-layered structure or the continuous film structure, the uppermost layer of the phase-shift film 104 be formed to essentially contain 1 at %~20 at % oxygen (O), thereby improving resistance of the phase-shift film 104 to chemicals and exposure light.

The phase-shift film 104 is formed by a sputtering process. If the phase-shift film 104 is made of the metal silicide or its compounds, a target may be formed using a target where metal and silicon (Si) are separately provided, or using a metal silicide target. At this time, the metal silicide target has a composition ratio of metal:silicon (Si)=1 at %~10 at %:90 at %~99 at % and preferably a composition ratio of Mo:Si=1 at %~6 at %:94 at %~99 at %. Further, if the target contains boron (B), the target has a composition ratio of metal: Si:B=1 at %~10 at %:80 at %~98 at %:1 at %~10 at %. If the content of metal in the phase-shift film 104 is higher than 10 at %, the characteristics of metal makes it difficult to secure a transmissivity of about 30% with regard to exposure light having a wavelength of 193 nm or 248 nm. Therefore, the content of metal in the target has to be equal to or lower than 10 at %.

The phase-shift film 104 has a thickness of 500 Å~850 Å, and preferably a thickness of 550 Å~650 Å, a phase-shift degree of 170°~190° with respect to exposure light having a wavelength of 193 nm or 248 nm, and a surface reflectivity of 20%~30%.

The phase-shift film 104 has a transmissivity of 10%~50% with respect to the exposure light having the wavelength of 193 nm or 248 nm. If the transmissivity of the phase-shift film 104 is lower than 10%, the effects of the phase shift are poor since the intensity of the exposure light for destructive interference is low when the resist film applied to a wafer is exposed to the exposure light. On the other hand, if the transmissivity is higher than 50%, the resist film applied to the wafer is damaged, thereby increasing a loss of the resist film.

The phase-shift film 104 may selectively undergo thermal treatment at a temperature of 100° C. to 500° C. so as to control its resistance to chemicals and flatness.

The light-shielding film 106 is provided as a single layered structure or a multi-layered structure on the phase-shift film 104, and is made of a material that has an etch selectivity of not less than 10 with regard to the phase-shift film 104.

The light-shielding film 106 may contain one or more kinds of substance among tantalum (Ta), nickel (Ni), zirconium (Zr), niobium (Nb), palladium (Pd), zinc (Zn), tin (Sn), chromium (Cr), aluminum (Al), manganese (Mn), cadmium (Cd), magnesium (Mg), lithium (Li), selenium (Se), hafnium (Hf), tungsten (W) and silicon (Si), or may further contain one or more kinds of substance among nitrogen (N), oxygen (O), carbon (C), boron (B) and hydrogen (H) in addition to that substance.

The light-shielding film 106 may for example contain chrome (Cr) or a chrome (Cr) compound, where chromium (Cr) is combined with the light element, such as CrN, CrC, CrO, CrCN, CrON, CrCO and CrCON. If the light-shielding film 106 is made of a chromium (Cr) compound, the light-shielding film 106 has a composition ratio among 30 at %~70 at % chromium (Cr), 10 at %~40 at % nitrogen (N), 0~50 at % oxygen (O), 0~30 at % carbon (C), 0~30 at % boron (B), and 0~30 at % hydrogen (H).

The light-shielding film 106 may have the multi-layered structure of two or more layers. At this time, the multi-layered structure includes a film for adjusting an etching speed and a film for adjusting optical density (OD).

Referring to FIG. 2, the light-shielding film 106 includes a first light-shielding layer 114 and a second light-shielding layer 116 that are made of a chromium (Cr) compound where chromium (Cr) is combined with a light element.

The first light-shielding layer 114 is formed on the phase-shift film 104, and speeds up an etching process to thereby shorten time to be taken in etching the light-shielding film 106.

The first light-shielding layer 114 has a thickness of 300 Å~550 Å, which corresponds to 50% to 95% and preferably 70% to 90% of the thickness of the light-shielding film 106.

The first light-shielding layer 11 essentially contains oxygen (O) and thus speeds up the etching process. The first light-shielding layer 114 contains 10 at %~50 at % oxygen (O), and preferably 10 at %~20 at % oxygen (O). As the etching speed is raised, total time required for etching the light-shielding film 106 is shortened.

The second light-shielding layer 116 is formed on the first light-shielding layer 114 and serves to adjust the optical density. If the optical density is adjusted by only the first light-shielding layer 114, the first light-shielding layer 114 becomes thicker to meet the optical properties required for the light-shielding film 106. Therefore, the second light-shielding layer 116 is added to supplement the optical density required for the light-shielding film 106.

The second light-shielding layer 116 has a thickness of 20 Å~150 Å, and preferably a thickness of 30 Å~100 Å.

The second light-shielding layer 116 is made of a chromium (Cr) compound that contains or does not contain oxygen (O).

Although the second light-shielding layer 116 with oxygen has to be thicker than that with no oxygen (O) in order to secure a certain light-shielding effect, the raised etching speed has the same effect in the etching time and the thickness of the resist film. At this time, the second light-shielding layer 116 contains 1 at %~20 at % oxygen (O) and preferably 1 at %~15 at % oxygen (O). If the content of oxygen (O) in the second light-shielding layer 116 is more than 20 at %, resistance to fluorine (F) gas used for etching the phase-shift film 104 is weakened and thus the second light-shielding layer 116 is damaged when the phase-shift film 104 is etched, thereby causing a problem of lowering the optical density.

If the second light-shielding layer 116 does not contain oxygen (O), the second light-shielding layer 116 contains 30 at %~70 at % chromium (Cr) and preferably 40 at %~50 at % chromium (Cr).

The light-shielding film 106 has a thickness of 300 Å~700 Å, and preferably a thickness of 350 Å~550 Å, and has an average etching speed of 2.0 Å/sec~4.0 Å/sec.

At a portion where the phase-shift film 104 and the light-shielding film 106 are stacked, an optical density is 2.5~3.5 and preferably 2.7~3.2 with respect to the exposure light having a wavelength of 193 nm or 248 nm, and a surface reflectivity is 20%~40% and preferably 25%~35%.

The light-shielding film 106 may selectively undergo thermal treatment. At this time, temperature for this thermal treatment may be equal to or lower than that for the under phase-shift film 104.

The resist film 114 uses a chemically amplified resist (CAR), and has a thickness of 400 Å~1500 Å and preferably 400 Å~1200 Å.

Figure 3:
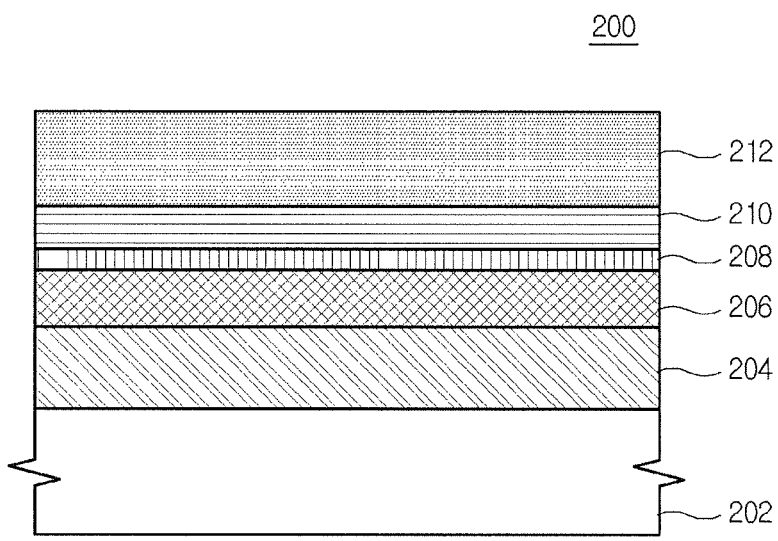
FIG. 3 is a cross-section view of a phase-shift blankmask according to a third embodiment of the present invention.
Figure 4:
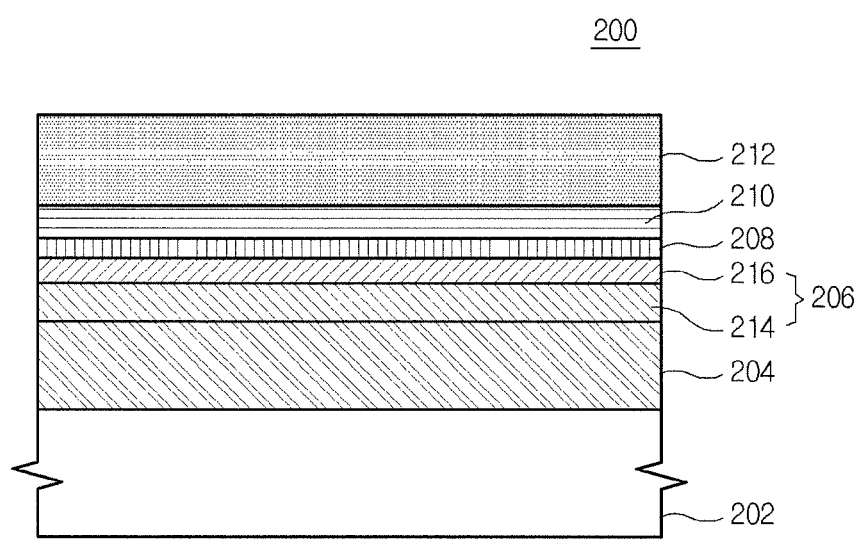
FIG. 4 is a cross-section view of a phase-shift blankmask according to a fourth embodiment of the present invention.

FIG. 3 is a cross-section view of a phase-shift blankmask according to a third embodiment of the present invention, and FIG. 4 is a cross-section view of a phase-shift blankmask according to a fourth embodiment of the present invention.

Referring to FIG. 3 and FIG. 4, a phase-shift blankmask 200 according to the present invention includes a transparent substrate 202; and a phase-shift film 204, a light-shielding film 206, an etch-stopping film 208, a hard film 210 and a resist film 212 that are stacked in sequence on the transparent substrate 202. In these embodiments, the phase-shift film 204, the light-shielding film 206 and the resist film 212 have the same optical, chemical and physical properties as those of the first and second embodiments.

The etch-stopping film 208 is provided on the light-shielding film 206 and protects the under light-shielding film 206 when the hard film 210 (to be described later) is patterned or removed. Further, the etch-stopping film 208 serves as an etching mask for patterning the light-shielding film 206. Thus, the etch-stopping film 208 is made of a substance that has an etch selectivity higher than 10 with regard to the hard film 210 and the light-shielding film 206. To simplify the etching process, if the etch-stopping film 208 is removed when the phase-shift film 204 is patterned, the etch-stopping film 208 may be made of a substance having the same etching properties as the phase-shift film 204.

The etch-stopping film 208 contains one or more substances among silicon (Si), molybdenum (Mo), tantalum (Ta), vanadium (V), cobalt (Co), nickel (Ni), zirconium (Zr), niobium (Nb), palladium (Pd), zinc (Zn), chromium (Cr), aluminum (Al), manganese (Mn), cadmium (Cd), magnesium (Mg), lithium (Li), selenium (Se), copper (Cu), hafnium (Hf) and tungsten (W), or contains one or more substances among nitrogen (N), oxygen (O), carbon (C), boron (B) and hydrogen (H) in addition to that substance.

The etch-stopping film 208 may be for example made of one of silicon (Si) compounds such as silicon (Si) or SiN, SiC, SiO, SiCN, SiCO, SiNO, SiCON, SiB, SiBN, SiBC, SiBO, SiBCN, SiBCO, SiBNO and SiBCON. Further, the etch-stopping film 208 may be for example made of one of metal silicide compounds such as molybdenum silicide (MoSi) or MoSiN, MoSiC, MoSiO, MoSiCN, MoSiCO, MoSiNO, MoSiCON, MoSiB, MoSiBN, MoSiBC, MoSiBO, MoSiBCN, MoSiBCO, MoSiBNO and MoSiBCON.

If the etch-stopping film 208 is made of the silicon (Si) compound, the etch-stopping film 208 has a composition ratio between 40 at %~90 at % silicon (Si) and 10 at %~60 at % light element, and preferably a composition ratio between 50 at %~85 at % silicon (Si) and 15 at %~50 at % light element. Further, if the etch-stopping film 208 is made of metal silicide or its compound, the etch-stopping film 208 has a composition ratio among 0.1 at %~10 at % metal, 39 at %~85 at % silicon (Si) and 10 at %~60 at % light element, and preferably a composition ratio among 0.1 at %~5 at % metal, 50 at %~80 at % silicon (Si) and 15 at %~50 at % light element.

The etch-stopping film 208 has a thickness of 20 Å~150 Å and preferably a thickness of 30 Å~100 Å.

The hard film 210 is provided on the etch-stopping film 208 and serves as an etching mask for the etch-stopping film 208. Thus, the hard film 210 is made of a substance that has an etch selectivity equal to or higher than 10 with regard to the etch-stopping film 208. To simplify the etching process, the hard film 210 is made of a material that has the same etching properties as the light-shielding film 206 if the hard film 210 is removed when the light-shielding film 206 is patterned.

The hard film 210 contains one or more substances among tantalum (Ta), nickel (Ni), zirconium (Zr), niobium (Nb), palladium (Pd), zinc (Zn), tin (Sn), chromium (Cr), aluminum (Al), manganese (Mn), cadmium (Cd), magnesium (Mg), lithium (Li), selenium (Se), hafnium (Hf), tungsten (W) and silicon (Si), or contains one or more light elements among nitrogen (N), oxygen (O), carbon (C), boron (B) and hydrogen (H) in addition to that substance.

The hard film 210 may be for example made of chromium (Cr) or a chromium (Cr) compound, where chromium (Cr) is combined with the light element, such as CrN, CrC, CrO, CrCN, CrNO, CrCO and CrCON. Further, the hard film 210 may be made of a compound, where chromium (Cr) or the chromium (Cr) compound is combined with tin (Sn), such as CrSn, CrSnN, CrSnC, CrSnO, CrSnCN, CrSnNO, CrSnCO and CrSnCON.

The higher the etching speed of the hard film 210, the easier it is to make the resist film 214 thinner. Thus, the hard film 210 has an etching speed of 0.4 Å/sec or higher, and preferably 1.0 Å/sec or higher.

The hard film 210 has a thickness of 20 Å~100 Å, and preferably 30 Å~60 Å. If the hard film 210 has a thickness of not more than 20 Å, it is difficult for the resist film 214 to serve as the etching mask. On the other hand, if the hard film 210 has a thickness of not less than 100 Å, it is difficult to make the resist film 212 thinner and therefore difficult to achieve a pattern of high resolution.

Below, the phase-shift blank mask will be described in detail according to the embodiments of the present invention.

Examples

Evaluation of Properties Based on Substances for Phase-Shift Film

The phase-shift films of the phase-shift blankmask according to the embodiments of the present invention were made of silicon (Si), a silicon (Si) compound and a molybdenum silicide (MoSi) compound and then evaluated with respect to transmissivity and phase shift according to thickness.

lems in forming a phase-shift film that has high transmissivity.

On the other hand, the phase-shift film using the molybdenum silicide (MoSi) target (Mo:Si=10:90) according to the comparative examples 1 to 2 exhibited the transmissivity of 6.2% under the condition that the thickness and the phase-shift degree are satisfied. Therefore, the comparative examples 1 to 2 did not satisfy the transmissivity of 10%~50% required for the phase-shift film according to the present invention. Since a thickness of 900 Å is needed even through the transmissivity and the phase-shift degree are satisfied by increasing the content of nitrogen (N), it is impossible to satisfy the thickness (500 Å~850 Å) required for the phase-shift film according to the present invention Evaluation of Chemical Resistance of Phase-Shift Film's The phase-shift films according to the embodiments of the present invention were manufactured to have a single layered structure and a multi-layered structure of two or more layers, and tested with respect to the chemical resistance to SC-1 and SPM solutions. All the phase-shift films were made of the molybdenum silicide (MoSi) target (by a composition ratio Mo:Si=2 at %:98 at %), and the other conditions such as the substrate, the thermal treatment, etc. except the phase-shift film were equally applied.

In the inventive example 5, a molybdenum silicide nitride (MoSiN) film was grown for 550 seconds under process gas of Ar:$N_2$=7 sccm:8.5 sccm and process power of 0.7 kW, and then underwent thermal treatment using vacuum rapid thermal process (RTP) equipment at 350° C. for 30 minutes.

The transmissivity and phase-shift degree of the phase-shift film were measured using the n&k analyzer 3700RT. In result, the transmissivity was 18.2% and the phase-shift degree was 183°. Further, the thickness of the phase-shift film was measured using X-ray reflectometer (XRR) equipment. In result, the upper layer exhibited a thickness of 584 Å.

In the inventive example 6, a molybdenum silicide nitride (MoSiN) film was grown for 900 seconds under process gas of Ar:$N_2$=7 sccm:20 sccm and process power of 0.7 kW. Subsequently, a molybdenum silicide oxide nitride (MoSiON) film was grown for 80 seconds under process gas of Ar:$N_2$=7 sccm:7 sccm and process power of 0.7 kW, thereby forming a double-layered phase-shift film having high transmissivity.

TABLE 1

|  | Inventive example 1 | Inventive example 2 | Inventive example 3 | Inventive example 4 | Comparative example 1 | Comparative example 2 |
| --- | --- | --- | --- | --- | --- | --- |
| Target | Si | SiB | MoSi | MoSi | MoSi | MoSi |
| Target composition ratio (at %) | 100 | Si:B = 99:1 | Mo:Si = 2:98 | Mo:Si = 5:95 | Mo:Si = 10:90 | Mo:Si = 10:90 |
| Gas (sccm) Ar:N2 | 7:3.5 | 7:7.5 | 7:8.2 | 7:8.5 | 7:9 | 7:20 |
| Transmissivity (%) (@193 nm) | 30.1 | 25 | 20.5 | 13.2 | 6.2 | 10.1 |
| Phase shift (°) (@193 nm) | 182 | 182 | 183 | 182 | 182 | 181 |
| Thickness (Å) | 565 | 572 | 584 | 602 | 650 | 900 |

Referring to Table 1, the phase-shift films using silicon according to the inventive examples 1 to 4 exhibited the transmissivities of 13.2%~30.1%, Thus, there were no prob- The transmissivity, phase-shift degree and thickness of the double-layered phase-shift film were measured using the same equipment. In result, the transmissivity was 20.1%, and the phase-shift degree was 184°. Further, the upper layer of the phase-shift film exhibited a thickness of 540 Å, and the lower layer exhibited a thickness of 50 Å.

In the inventive example 7, a molybdenum silicide nitride (MoSiN) film was grown for 400 seconds under process gas of Ar:$N_2$=7 sccm:25 sccm and process power of 0.7 kW. Subsequently, a molybdenum silicide nitride (MoSiN) film was grown for 800 seconds under process gas of Ar:$N_2$=7 sccm:15 sccm and process power of 0.7 kW. Next, a molybdenum silicide oxide (MoSiO) film was grown for 80 seconds under process gas of Ar:$N_2$=5 sccm:10 sccm and process power of 0.7 kW, thereby forming a triple-layered phase-shift film having high transmissivity.

In the inventive example 7, the transmissivity, phase-shift degree and thickness of the triple-layered phase-shift film were also measured. In result, the transmissivity was 19.1%, and the phase-shift degree was 185°. Further, the first layer of the phase-shift film exhibited a thickness of 150 Å, the second layer exhibited a thickness, and the third layer exhibited a thickness of 50 Å.

The chemical resistances of the foregoing phase-shift films were tested with regard to SC-1 and SPM.

For the evaluation about SC-1, the phase-shift films were cleaned three times at about 45° C. for 20 minutes with a solution, where $NH_4OH$, $H_2O_2$ and $H_2O$ are mixed at a volume ratio of $NH_4OH$:$H_2O_2$:$H_2O$=1:1:5. Then, change in the phase-shift degree and the transmissivity between before and after the cleaning process was measured.

For the evaluation about SPM, the phase-shift films were cleaned three times at about 90° C. for 10 minutes with a solution, where $H_2SO_4$ and $H_2O_2$ are mixed at a ratio of $H_2SO_4$:$H_2O_2$=9:1. Then, change in the phase-shift degree and the transmissivity between before and after the cleaning process was measured.

TABLE 2

| | | Inventive example 5 | Inventive example 6 | Inventive example 7 |
|---|---|---|---|---|
| | Structure | Single layer | Double layers | Triple layers |
| | Substance of surface layer | MoSiN | MoSiON | MoSiO |
| SC-1 | Change in transmissivity (@193 nm) | 0.3% | 0.1% | 0.8% |
| | Change in phase-shift degree (@193 nm) | 2.5° | 1.0° | 0.6° |
| SPM | Change in transmissivity (@193 nm) | 0.15% | 0.08% | 0.06% |
| | Change in phase-shift degree (@193 nm) | 1.5° | 0.7° | 0.5° |

Referring to Table 2, in the case of SC-1, the inventive example 5 exhibited a phase-shift degree change of 2.5° and a transmissivity change of 0.3% at the exposure light of 193 nm; the inventive example 6 exhibited a phase-shift degree change of 1.0° and a transmissivity change of 0.1% at the exposure light of 193 nm; and the inventive example 7 exhibited a phase-shift degree change of 0.6° and a transmissivity change of 0.8% at the exposure light of 193 nm.

In the case of SPM, the inventive example 5 exhibited a phase-shift degree change of 1.5° and a transmissivity change of 0.15% at the exposure light of 193 nm; the inventive example 6 exhibited a phase-shift degree change of 0.7° and a transmissivity change of 0.08% at the exposure light of 193 nm; and the inventive example 7 exhibited a phase-shift degree change of 0.5° and a transmissivity change of 0.06% at the exposure light of 193 nm.

As the results of evaluating the chemical resistance, all the inventive examples 5 to 7 exhibited the transmissivity change and the phase-shift degree change within satisfactory ranges. Further, comparison in the chemical resistance among the inventive examples 5 to 7 showed that the chemical resistance is improved as the content of oxygen in the surface layer increases.

Evaluation of Light-Shielding Film Against Etching

When the light-shielding film of the phase-shift blankmask according to the inventive examples are etched by etching gas including fluorine (F) gas, change in the thickness and optical density of the light-shielding film was evaluated according to substances in the uppermost layer of the light-shielding film.

The light-shielding films are all made of the chromium (Cr) target, and the first light-shielding layer used in common was formed by growing a chromium oxide nitride (CrON) to a thickness of 300 Å under process gas of Ar:$N_2$:NO=5 sccm:10 sccm:5 sccm and process power of 1.0 kW.

In the inventive example 8, a second light-shielding layer was formed on the first light-shielding layer by growing chromium nitride (CrN) to a thickness of 302 Å under process gas of Ar:$N_2$:=3 sccm:5 sccm and process power of 0.8 kW.

In the inventive example 9, a second light-shielding layer was formed on the first light-shielding layer by growing chromium oxide nitride (CrON) to a thickness of 298 Å under process gas of Ar:$N_2$:NO=5 sccm:10 sccm:2 sccm and process power of 0.8 kW.

The formed light-shielding films were patterned by the etching process using the etching gas containing fluorine (F) gas, and then the change in the thickness and optical density of the light-shielding film was measured.

TABLE 3

| | | Thickness of light-shielding film | | | Optical density of light-shielding film | | |
|---|---|---|---|---|---|---|---|
| | Substance | Before etching | After etching | Change | Before etching | After etching | Change |
| First light-shielding layer | CrON | | 300 Å | | | 1.30 | |
| Inventive example 8 Second light-shielding layer | CrN | 302 Å | 298 Å | 4 Å | 2.25 | 2.24 | 0.01 |

TABLE 3-continued

| | | | Thickness of light-shielding film | | | Optical density of light-shielding film | | |
|---|---|---|---|---|---|---|---|---|
| | | Substance | Before etching | After etching | Change | Before etching | After etching | Change |
| Inventive example 9 | Second light-shielding layer | CrON | 300 Å | 293 Å | 7 Å | 2.05 | 2.02 | 0.03 |

Referring to Table 3, the second light-shielding layer (CrN) with no oxygen according to the inventive example 8 was changed in thickness by 4 Å, and the second light-shielding layer (CrON) with a little oxygen according to the inventive example 8 was changed in thickness by 7 Å.

The change in thickness of the second light-shielding layer has an effect on a basic function, i.e. The light-shielding function of the light-shielding film. Thus, the inventive example 8 exhibited the change in optical density by 0.01, and the inventive example 9 exhibited the change in optical density by 0.03.

As compared with the chromium nitride (CrN) film, the chromium oxide nitride (CrON) film with a little oxygen (O) leaded to a relatively bad result in terms of change in thickness and optical density, but it is enough to be applied to the uppermost layer of the light-shielding film, i.e. The second light-shielding layer.

Further, the loss in thickness of the first and second light-shielding layers is insignificant enough not to cause a problem in the light-shielding function of the light-shielding film, and therefore the inventive examples 8 and 9 are actually applicable to the light-shielding film.

Evaluation of Light-Shielding Film with Regard to Optical Density

In the phase-shift blankmask according to the inventive examples, the transmissivity of the phase-shift film and the optical density of the transmissivity were evaluated. According to the inventive examples 10 to 12, all the first light-shielding films were formed under the same condition, and the optical density was adjusted while changing the thickness of the first light-shielding film and the substances of the second light-shielding film.

The first light-shielding layer was formed by growing a chromium oxide nitride (CrON) film to a thickness of 480 Å to 485 Å under process gas of Ar:$N_2$:NO=5 sccm:10 sccm:5 sccm and process power of 1.0 kW.

In the inventive example 10, a chromium oxide nitride (CrON) layer was formed to a thickness of 480 Å on the phase-shift film having a transmissivity of 20%, and then the second light-shielding layer was formed to 80 Å by applying process gas of Ar:$N_2$:NO=5 sccm:10 sccm:2 sccm and process power of 0.8 kW to the formed chromium oxide nitride (CrON) layer.

In the inventive example 11, a chromium oxide nitride (CrON) layer was formed to a thickness of 485 Å on the phase-shift film having a transmissivity of 25%, and then the second light-shielding layer of chromium oxide nitride (CrON) was formed to 90 Å by applying process gas of Ar:$N_2$=3 sccm:5 sccm and process power of 0.8 kW to the formed chromium oxide nitride (CrON) layer.

In the inventive example 12, a chromium oxide nitride (CrON) layer was formed to a thickness of 485 Å on the phase-shift film having a transmissivity of 30%, and then the second light-shielding layer of chromium oxide nitride (CrON) was formed to 100 Å by applying process gas of Ar:$N_2$=3 sccm:5 sccm and process power of 0.8 kW to the formed chromium oxide nitride (CrON) layer.

In the comparative example 3, a light-shielding layer of chromium nitride (CrN) was formed to a thickness of 485 Å on the phase-shift film having a transmissivity of 20% under process gas of Ar:$N_2$=3 sccm:5 sccm and process power of 0.8 kW, and then an anti-reflective layer of chromium oxide nitride (CrON) was formed to a thickness of 120 Å under process gas of Ar:$N_2$:NO=5 sccm:10 sccm:2 sccm and process power of 0.8 kW.

Regarding the inventive examples 10 to 12, where the phase-shift film and the light-shielding film are stacked, and the comparative example 3, an optical density, an average etching speed, and a residual film thickness of the resist film after forming a pattern were measured.

TABLE 4

| | | Inventive example 10 | Inventive example 11 | Inventive example 12 | Comparative example 3 |
|---|---|---|---|---|---|
| Phase-shift film | Transmissivity | 20% | 25% | 30% | 20% |
| First light-shielding film | Substances | CrON | CrON | CrON | CrN |
| | Film thickness | 480 Å | 485 Å | 485 Å | 410 Å |
| Second light-shielding film | Substances | CrON | CrN | CrN | CrON |
| | Film thickness | 80 Å | 90 Å | 100 Å | 120 Å |
| Optical density(@193 nm) | | 2.8 | 2.6 | 2.7 | 3.0 |
| Average etching speed | | 2.3 Å/sec | 2.1 Å/sec | 2.0 Å/sec | 1.36 Å/sec |

TABLE 4-continued

|  |  | Inventive example 10 | Inventive example 11 | Inventive example 12 | Comparative example 3 |
|---|---|---|---|---|---|
| Resist film | Film thickness | 100 nm | 100 nm | 100 nm | 100 nm |
|  | Residue after etching | 35 nm | 27 nm | 25 nm | 0 |

Referring to Table 4, the inventive examples 10 to 12 and the comparative example 3 are suitable for the photomask after forming a pattern since they all exhibited the optical density of 2.6 to 3.0.

However, in terms of the average etching speed, the inventive examples 10 to 12 exhibited an etching speed of 2.0 Å/sec to 2.3 Å/sec, which is faster than 1.36 Å/sec of the comparative example 3. In terms of the residual film thickness of the resist film after forming the pattern, the comparative example 3 has no residual resist film after forming the pattern, but the inventive examples 10 to 12 has a residual resist film of 25 nm to 35 nm so that the resist film can be formed as a thin film.

Manufacture of Phase-Shift Blankmask I According to the Present Invention

To manufacture the phase-shift blankmask according to the present invention, a synthesized quartz glass substrate was prepared to have a size (a length×a width×a thickness=6 inch×6 inch×0.25 inch), a double-refractive index of 2 nm/6.3 mm, and a flatness (total indicated reading, TIR) of 2,560 Å.

Using a direct current (DC) magnetron reactive sputter, the phase-shift film was formed to have high transmissivity on the glass substrate. The phase-shift film was formed by growing a molybdenum silicide (MoSiN) film for 550 seconds while using the molybdenum silicide (MoSi) target (a composition ratio of Mo:Si=2 at %:98 at %) under process gas of $Ar:N_2$=7 sccm:8.5 sccm and process power of 0.7 kW. Then, the phase-shift film underwent thermal treatment at 350° C. for 30 minutes through the vacuum rapid thermal process (RTP) equipment The transmissivity and phase-shift degree of the phase-shift film were measured using the n&k analyzer 3700RT. In result, the transmissivity was 18.2%, and the phase-shift degree was 183°. Further, the thickness of the phase-shift film was measured using an X-ray Reflectometer (XRR). In result, the thickness was 58.4 nm. In addition, the composition ratio of the phase-shift film was analyzed using Auger electron spectroscopy (AES). In result, the composition ratio of 2.1 at % molybdenum (Mo), 70.1 at % silicon (Si), and 27.8 at % nitrogen (N) was exhibited. Besides, to compare the phase-shift films with respect to change in flatness according to film growth, the flatness of the phase-shift films was measured using ultra-flat equipment. IN result, the TIR was 3,120 Å. Due to difference of 560 Å in flatness change from the foregoing transparent substrate having a flatness of 2,560 Å, it will be indirectly understood that pattern alignment and DoF margin are excellent at the following exposure process with the photomask and wafer (i.e. wafer printing).

The light-shielding film having the first light-shielding layer and the second light-shielding layer was grown on the phase-shift film. All the light-shielding films used the chromium (Cr) target, and the first light-shielding layer was formed by growing a chromium oxide nitride (CrON) film for 368 seconds under process gas of $Ar:N_2:NO$=5 sccm:10 sccm:5 sccm and process power of 1.0 kW. The second light-shielding layer was formed by growing a chromium nitride (CrN) film for 60 seconds under process gas of $Ar:N_2$=3 sccm:5 sccm and process power of 0.8 kW. Regarding the first light-shielding layer and the second light-shielding layer, the film thickness was measured by the same method as that of the foregoing phase-shift film. In result, the first light-shielding layer was 48 nm, the second light-shielding layer was 5 nm. The composition ratios of the first light-shielding layer and the second light-shielding layer were analyzed as follows: the first light-shielding layer exhibited a composition ration of 48 at % chromium (Cr), 30 at % nitrogen (N) and 22 at % oxygen (O), and the second light-shielding layer exhibited a composition ratio of 58 at % chromium (Cr) and 42 at % nitrogen (N). Further, the optical density of the film, where the phase-shift film and the light-shielding film were stacked, was measured. In result, the optical density was 2.95 at the exposure light having a wavelength of 193 nm, and the reflectivity was 33%.

The etch-stopping film was grown on the light-shielding film. The etch-stopping film was formed by growing a molybdenum silicide oxide nitride (MoSiON) film to a thickness of 20 Å while using the molybdenum silicide (MoSi) target (a composition ratio Mo:Si=2 at %:98 at %) under process gas of $Ar:N_2:NO$=3 sccm:3 sccm:5 sccm and process power of 0.6 kW. As a result of analyzing the composition ratio of the etch-stopping film, the etch-stopping film exhibited the composition ratio of 1.5 at % molybdenum (Mo), 60.3 at % silicon (Si), 12.5 at % oxygen (O) and 25.7 at % nitrogen.

The hard film was grown on the etch-stopping film. The hard film was formed by growing a chromium (Cr) film to a thickness of 40 Å while using a chromium (Cr) target under process gas of Ar (=8 sccm) and process gas of 0.6 kW.

Chemical amplified resist was formed to a thickness of 100 nm on the hard film by a spin coating method, thereby completing the blankmask according to the present invention.

Manufacture of Phase-Shift Blankmask II According to the Present Invention

With reference to the foregoing manufacture I of the phase-shift blankmask, the phase-shift blankmask different in composition of the second light-shielding layer was manufactured. Except the second light-shielding layer, the substrate and the metal films have the same physical, chemical and optical properties as those described above.

To form the second light-shielding layer, the chromium (Cr) target was used. The second light-shielding layer was formed by growing a chromium oxide nitride (CrON) film for 75 seconds under process gas of $Ar:N_2:NO$=5 sccm:10 sccm:2 sccm and process power of 0.8 kW.

After growing the film, the thickness of the film was measured using the X-ray Reflectometer (XRR) using an X-ray. In result, the thickness of the second light-shielding layer was 7.5 nm. To analyze the composition ratio, the Auger electron spectroscopy (AES) was used. In result, the composition ration of 54 at % chromium (Cr), 7 at % oxygen (O) and 39 at % nitrogen (N) was exhibited. Further, the optical density of the film, where the phase-shift film and the light-shielding film were stacked, was measured. In result, the optical density was 2.92 at the exposure light having a wavelength of 193 nm and reflectivity of 31%.

Manufacture of Phase-Shift Photomask According to the Present Invention

The foregoing phase-shift blankmask underwent the exposure process using an electron beam and a post exposure bake process using a hot plate at a temperature of 190° C. for 10 minutes, and then the resist film was developed to form a resist film pattern.

Then, the under hard film was etched by the etching gas including chlorine (Cl) gas while using the resist pattern as the etching mask, thereby forming a hard film pattern. After removing the resist film, the hard film pattern was used as the etching mask to etch the under etch-stopping film including silicon (Si) with the etching gas including fluorine (F) gas, thereby forming an etch-stopping film pattern.

Next, the etch-stopping film pattern was used as the etching mask for etching the under light-shielding flu with the etching gas including chlorine (Cl) gas, thereby forming a light-shielding film pattern. At this time, the hard film pattern has the same etching properties as the etch-stopping film, and is therefore fully removed while forming the etch-stopping film pattern.

Subsequently, the light-shielding film pattern was used as the etching mask for etching the under phase-shift film with the etching gas including fluorine (F) gas, thereby forming the phase-shift film pattern. At this time, the etch-stopping film pattern has the same etching properties as the phase-shift film, and is therefore fully removed while forming the etch-stopping film pattern.

Then, the resist film pattern is formed on a product including the phase-shift film pattern, and the light-shielding film pattern is removed from a blind area where the main pattern is not formed, thereby completely manufacturing the phase-shift photomask Manufacture of Phase-Shift Blankmask, Having No Etch-Stopping Film, and Photomask For comparison with the foregoing manufacture I of the phase-shift blankmask according to the present invention, a phase-shift blankmask according to the comparative example was manufactured by excluding the etch-stopping film, forming the hard film with a molybdenum silicide (MoSi) compound including silicon (Si) on the light-shielding film, and forming the resist film on the hard film.

The transparent substrate, the phase-shift film and the light-shielding film, which constitute the phase-shift blankmask according to the comparative example, are the same as those of the inventive examples of the present invention.

The hard film according to the comparative example was formed by using a molybdenum silicide (MoSi) target (having a composition ratio Mo:Si=2 at %:98 at %) to have etch selectivity against the under light-shielding film with a chromium (Cr) compound and growing molybdenum silicide oxide nitride (MoSiON) film to a thickness of 40 Å under process gas of Ar:N$_2$:NO=3 sccm:5 sccm:5 sccm and process power of 0.6 kW.

Then, the chemical amplified resist was formed to a thickness of 1,000 Å on the hard film, thereby completing the phase-shift blankmask according to the comparative example.

However, the phase-shift blankmask according to the comparative example has an un-coating problem that the resist film is not partially applied on to the hard film made of the molybdenum silicide oxide nitride (MoSiON) film at respective edges of the transparent substrate. Therefore, a hexamethyldisilazane (HMDS) process was additionally performed on the hard film, and then the resist film was applied to the hard film, thereby solving the foregoing problem.

Using this phase-shift blankmask, the phase-shift photomask was manufactured by the same etching substances and method as those according to the present invention.

First, the resist film underwent the exposure and development processes to form the resist film pattern, and the resist pattern was used as the etching mask for etching the hard film made of molybdenum silicide oxide nitride (MoSiON) with etching gas including fluorine (F) gas to thereby form the hard film pattern. However, the resist pattern is formed with a scum having a thickness of about 2 Å~50 Å due to strong adhesion of the HMDS provided on the hard film while forming the hard film pattern, and therefore time to be taken in etching the hard film is prolonged. Further, byproducts caused by the scum of the resist pattern were counted as a defect.

TABLE 5

|  | With HMDS process | Without HMDS process |
| --- | --- | --- |
| Scum of resist film | None | 2 Å~50 Å |
| Defect caused by scum | 1ea~2ea | 10ea~20ea |

Referring to Table 5, the scum of the resist film according to the HMDS process and the defect caused by the scum at a dry etching process were analyzed. In result, the resist film was formed with the scum having the thickness of 2 Å~50 Å by the HMDS process, and it will be therefore understood that the defect at the dry etching process of the hard film is more increased by about 5~6 times than that of when the HMDS process is not performed.

Sheet Resistance Analysis of Phase-Shift Blankmask

To analyze a charge-up phenomenon with respect to the phase-shift blankmask based on the manufactures I and II of the phase-shift blankmask according to the present invention, a 4-point probe was used to measure the sheet resistance. Under the same conditions, the sheet resistance of the phase-shift blankmask having no etch-stopping film was also measured. Then, the measured sheet resistances were compared and analyzed.

In the following Table 6, the phase-shift blankmasks I and II manufactured according to the present invention are represented by the inventive examples 13 and 14, and the phase-shift blank mask having no etch-stopping film is represented by the comparative example 4.

TABLE 6

| Phase-shift blankmask | Inventive example 13 | Inventive example 14 | Comparative example 4 |
| --- | --- | --- | --- |
| Sheet resistance (Ω/□) | 520 | 550 | 3,025 |

Referring to Table 6, the sheet resistance of the phase-shift blankmask formed with the hard film, i.e. the thin film, which constitutes the phase-shift blankmask according to the inventive example 13, the inventive example 14 or the comparative example 4, was measured. The inventive example 13 exhibited 520Ω/□ and the inventive example 14 exhibited 550Ω/□, whereas the comparative example 4 exhibited 3,025Ω/□. Thus, it will be understood that the sheet resistance of the comparative example 4 is higher by about 15 times than those of the inventive examples 13 and 14, and has a serious charge-up phenomenon.

As described above, the phase-shift film of the present invention is formed to have a transmissivity of 6% or higher, thereby making a finer pattern.

Further, the hard film made of chromium (Cr) and the etch-stopping film, which is placed beneath the hard film and has different in etching properties from the light-shielding film, are used to solve a problem of adhesion between the hard film and the resist film. It is also possible to prevent spot or scum defects since an additional process such as the HMDS is not performed. In addition, it is possible to solve an electron charge-up phenomenon in the hard film containing silicon (Si).

Accordingly, the present invention provides a blankmask for manufacturing a photomask, which can achieve a fine pattern of not greater than 32 nm, preferably not greater than 14 nm, and more preferably not greater than 10 nm.

Although a few exemplary embodiments of the present invention have been described above, the technical scope of the present invention is not limited to the foregoing exemplary embodiments. It will be appreciated by those skilled in the art that changes and modifications may be made in these exemplary embodiments without departing from the principles and spirit of the invention, the scope of which is defined in the appended claims and their equivalents.

What is claimed is:

1. A phase-shift blankmask provided with a phase-shift film, a light-shielding film on a transparent substrate, and at least one of an etch-stopping film and a hard film formed on the light-shielding film,
the light-shielding film comprising multi-layered films of two or more layers containing at least one of oxygen (O) and nitrogen (N), wherein at least one of the films essentially contains oxygen (O),
the film essentially containing oxygen (O) occupying 50% to 95% of the whole thickness of the light-shielding film,
wherein the etch-stopping film comprises a substance that has the same etching properties as the phase-shift film, and
the hard film comprises a substance that is different in etching properties from the phase-shift film and the etch-stopping film, and has the same etching properties as the light-shielding film.

2. The phase-shift blankmask according to claim 1, wherein the phase-shift film comprises one of a single-layered structure, a multi-layered structure of two or more layers, and a continuous film structure, and
if the phase-shift film has the multi-layered structure or the continuous film structure, an uppermost part essentially contains oxygen (O).

3. The phase-shift blankmask according to claim 1, wherein the phase-shift film has a transmissivity of 10% to 50% with respect to exposure light having a wavelength of 193 nm or 248 nm.

4. The phase-shift blankmask according to claim 1, wherein the phase-shift film and the light-shielding film comprises one or more substances among silicon (Si), molybdenum (Mo), tantalum (Ta), vanadium (V), cobalt (Co), nickel (Ni), zirconium (Zr), niobium (Nb), palladium (Pd), zinc (Zn), chromium (Cr), aluminum (Al), manganese (Mn), cadmium (Cd), magnesium (Mg), lithium (Li), selenium (Se), copper (Cu), hafnium (Hf) and tungsten (W), or comprises one or more substances among nitrogen (N), oxygen (O), carbon (C), boron (B) and hydrogen (H) in addition to that substance.

5. The phase-shift blankmask according to claim 1, wherein the phase-shift film comprises one of silicon (Si), metal silicide, silicon (Si) compounds, and metal silicide compound, in which the silicon (Si) compounds and the metal silicide compound is respectively comprised by combining silicon (Si) and metal silicide with one or more light elements among nitrogen (N), oxygen (O), carbon (C), boron (B) and hydrogen (H).

6. The phase-shift blankmask according to claim 5, wherein if the phase-shift film comprises the silicon (Si) compound, the phase-shift film has a composition ratio of 40 at %~90 at % silicon (Si) and 10 at %~60 at % light element, and
if the phase-shift film comprises metal silicide or a metal silicide compound, the phase-shift film has a composition ratio of 0.1 at %~10 at % metal, 39 at %~90 at % silicon (Si) and 0~60 at % light element.

7. The phase-shift blankmask according to claim 1, wherein the phase-shift film has a thickness of 500 Å~850 Å, a phase-shift degree of 170°~190° with respect to exposure light having a wavelength of 193 nm or 248 nm, and a reflectivity of 20%~30%.

8. The phase-shift blankmask according to claim 1, wherein the light-shielding film comprises a chromium (Cr) compound having a composition ratio of 30 at %~70 at % chromium (Cr), 10 at %~40 at % nitrogen (N) and 50 at % or less of oxygen (O).

9. The phase-shift blankmask according to claim 8, wherein the light-shielding film further comprises one or more substances among carbon (C), boron (B) and hydrogen (H), and has a composition ratio of 0~30 at % carbon (C), 0~30 at % boron (B) and 0~30 at % hydrogen (H).

10. The phase-shift blankmask according to claim 1, wherein the light-shielding film has a thickness of 300 Å~700 Å.

11. The phase-shift blankmask according to claim 1, wherein the light-shielding film has an etching speed of 1.0 Å/sec~4.0 Å/sec.

12. The phase-shift blankmask according to claim 1, wherein the hard film comprises chromium (Cr) or one of chromium (Cr) compounds where chromium (Cr) is combined with one or more light elements among nitrogen (N), oxygen (O), carbon (C), boron (B) and hydrogen (H).

13. The phase-shift blankmask according to claim 12, wherein the etch-stopping film has a thickness of 20 Å~150 Å.

14. The phase-shift blankmask according to claim 1, wherein the hard film has a thickness of 20 Å~100 Å, and an etching speed of 0.4 Å/sec or higher.

15. A phase-shift photomask manufactured using the phase-shift blankmask according to claim 1.

* * * * *